US012707965B2

(12) United States Patent
Chen et al.

(10) Patent No.: US 12,707,965 B2
(45) Date of Patent: Aug. 11, 2026

(54) SEMICONDUCTOR DEVICE STRUCTURE HAVING A MULTI-LAYER CONDUCTIVE FEATURE AND METHOD MAKING THE SAME

(71) Applicant: Taiwan Semiconductor Manufacturing Co., Ltd., Hsin-Chu (TW)

(72) Inventors: Chun-Yuan Chen, HsinChu (TW); Chia-Hao Chang, Hsinchu City (TW); Cheng-Chi Chuang, New Taipei City (TW); Yu-Ming Lin, Hsinchu City (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/874,073

(22) Filed: Jul. 26, 2022

(65) Prior Publication Data

US 2022/0359388 A1 Nov. 10, 2022

Related U.S. Application Data

(62) Division of application No. 16/875,809, filed on May 15, 2020, now Pat. No. 11,532,550.

(Continued)

(51) Int. Cl.

*H10W 20/40* (2026.01)
*H10D 30/01* (2025.01)

(Continued)

(52) U.S. Cl.

CPC ........ *H10W 20/498* (2026.01); *H10D 30/024* (2025.01); *H10D 30/6211* (2025.01);

(Continued)

(58) Field of Classification Search

CPC ......... H01L 2924/00; H01L 2924/0002; H01L 29/4966; H01L 29/66545; H01L 23/53238

See application file for complete search history.

(56) References Cited

U.S. PATENT DOCUMENTS 7,115,999 B2 * 10/2006 Tsumura .......... H01L 21/76879 257/E21.585
7,514,319 B2 4/2009 Ahn et al.

(Continued)

FOREIGN PATENT DOCUMENTS

CN 104813446 A 7/2015
CN 109585283 A 4/2019

(Continued)

*Primary Examiner* — Tony Tran

(74) *Attorney, Agent, or Firm* — HAYNES AND BOONE, LLP

(57) ABSTRACT

The present disclosure provides a method of forming a semiconductor device structure. The method includes forming a trench in a dielectric layer on a semiconductor substrate; forming a bottom metal feature of a first metal in a lower portion of the trench by a selective deposition; depositing a barrier layer in an upper portion of the trench, the barrier layer directly contacting both a top surface of the bottom metal feature and sidewalls of the dielectric layer; and forming a top metal feature of a second metal on the barrier layer, filling in the upper portion of the trench, wherein the second metal is different from the first metal in composition.

20 Claims, 10 Drawing Sheets

Related U.S. Application Data

(60) Provisional application No. 62/880,806, filed on Jul. 31, 2019.

(51) Int. Cl.

| | |
|---|---|
| ***H10D 30/62*** | (2025.01) |
| ***H10D 64/01*** | (2025.01) |
| ***H10P 14/40*** | (2026.01) |
| ***H10P 14/46*** | (2026.01) |
| ***H10P 52/40*** | (2026.01) |
| ***H10W 10/00*** | (2026.01) |
| ***H10W 10/17*** | (2026.01) |
| ***H10W 20/00*** | (2026.01) |
| ***H10W 20/41*** | (2026.01) |
| ***H10W 20/43*** | (2026.01) |

(52) U.S. Cl.

CPC ......... *H10D 64/017* (2025.01); *H10P 14/418* (2026.01); *H10P 14/46* (2026.01); *H10P 52/403* (2026.01); *H10W 10/014* (2026.01); *H10W 10/17* (2026.01); *H10W 20/035* (2026.01); *H10W 20/057* (2026.01); *H10W 20/062* (2026.01); *H10W 20/081* (2026.01); *H10W 20/425* (2026.01); *H10W 20/43* (2026.01)

(56) References Cited

U.S. PATENT DOCUMENTS 7,768,127 B2 * 8/2010 Yamada ............ H01L 23/53295 257/E21.575
8,772,109 B2 7/2014 Colinge
8,785,285 B2 7/2014 Tsai et al.
8,816,444 B2 8/2014 Wann et al.
8,823,065 B2 9/2014 Wang et al.
8,860,148 B2 10/2014 Hu et al.
9,105,490 B2 8/2015 Wang et al.
9,236,267 B2 1/2016 De et al.
9,236,300 B2 1/2016 Liaw
9,520,482 B1 12/2016 Chang et al.
9,576,814 B2 2/2017 Wu et al.
9,716,063 B1 * 7/2017 Edelstein .......... H01L 21/76849
2004/0175920 A1 * 9/2004 Derderian ............... H01L 28/82 257/E21.59
2005/0093168 A1 5/2005 Tsumura et al.
2005/0121791 A1 6/2005 Yamada et al.
2014/0183738 A1 7/2014 Jezewski et al.
2015/0061041 A1 3/2015 Lin et al.
2016/0197013 A1 * 7/2016 Backes ............. H01L 21/76802 438/627
2019/0096681 A1 3/2019 Wei et al.
2019/0139820 A1 5/2019 Yang et al.
2019/0139821 A1 5/2019 Yang et al.
2020/0251386 A1 8/2020 Bhosale et al.

FOREIGN PATENT DOCUMENTS

KR 20060063129 A 6/2006
KR 20150070339 A 6/2015
KR 20170095829 A 8/2017
TW 201727860 A 8/2017
TW 200739695 A 10/2017
TW 201906126 A 2/2019

* cited by examiner

Z
Y
X

SEMICONDUCTOR DEVICE STRUCTURE HAVING A MULTI-LAYER CONDUCTIVE FEATURE AND METHOD MAKING THE SAME

PRIORITY DATA

This application is a divisional application of U.S. patent application Ser. No. 16/875,809, filed May 15, 2020, which is a non-provisional application of and claims priority to U.S. Provisional Patent Application Ser. No. 62/880,806, filed Jul. 31, 2019, the entire disclosures of which are hereby incorporated herein by reference.

BACKGROUND

The semiconductor integrated circuit (IC) industry has experienced exponential growth. Technological advances in IC materials and designs have produced generations of ICs, with each generation having smaller and more complex circuits than the previous generation. In the course of IC evolution, functional density (e.g., the number of interconnected devices per chip area) has generally increased while feature size (e.g., the smallest component, or line, that can be created using a fabrication process) has decreased.

Despite advances in materials and fabrication techniques, scaling of planar devices, such as metal-oxide-semiconductor field effect transistor (MOSFET) devices, has proven challenging. To overcome these challenges, non-planar transistors have been developed, examples being fin-like field effect transistors (FinFETs) and gate-all-around (GAA) transistors. Advantages of non-planar transistors include reduced short-channel effect, reduced current leakage, and higher current flow. To further improve the performance of such non-planar transistors, there has been a push towards the use of high-mobility channels. As an example, a silicon germanium alloy is a promising channel material because of its high-carrier mobility. The transistor scaling also has challenges in an interconnect structure, including the resistance and RC delay. For example, various conductive features, such as contacts, vias or metal lines, of the interconnect structure have smaller dimensions, causing high contact resistance. Conventional conductive features also include a barrier layer, which further reduces the dimensions of the contacts holes. Furthermore, metal filling is another challenge on concerns, such as voids or other defects.

Therefore, although existing devices and the interconnect structure have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
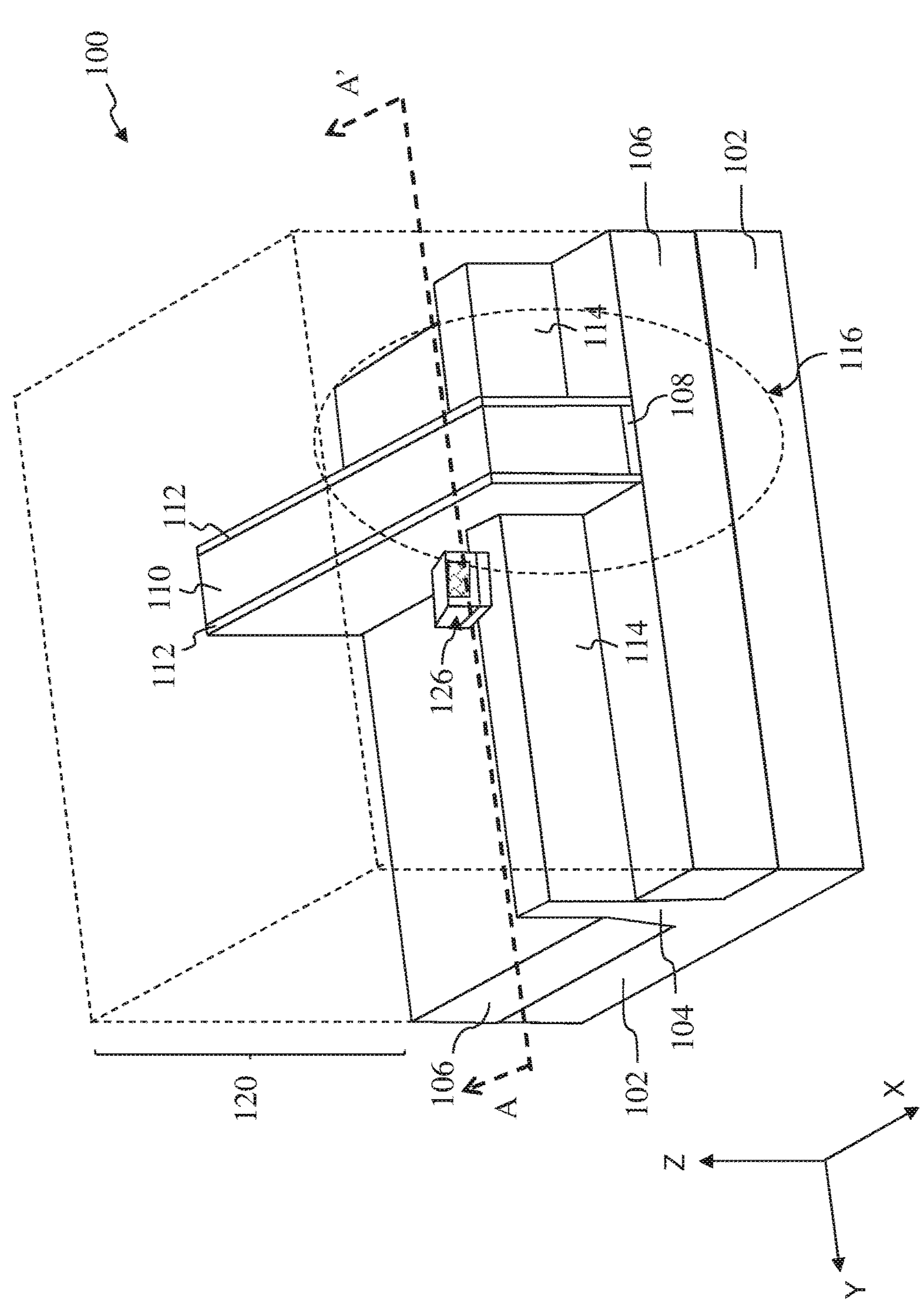
FIG. 1 shows a three-dimensional view of a semiconductor device structure, in accordance with an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

IC manufacturing process flow is typically divided into three major categories: front-end-of-line (FEOL), middle-end-of-line (MEOL), and back-end-of-line (BEOL). FEOL generally encompasses processes related to fabricating IC devices, such as transistors. For example, FEOL processes may include forming isolation features, gate structures, and source and drain features (generally referred to as source/drain features). MEOL generally encompasses processes related to fabricating contacts to conductive features (or conductive regions) of the IC devices, such as contacts to the gate structures and/or the source/drain features. BEOL generally encompasses processes related to fabricating interconnect structures that interconnect IC features fabricated by FEOL processes (referred to herein as FEOL features or structures) and MEOL processes (referred to herein as MEOL features or structures), thereby enabling operation of the IC devices. For example, BEOL processes may include forming multilayer interconnect features that facilitate operation of the IC devices. Such multilayer interconnect features may include contacts, insulating layers (dielectrics), metal levels, and bonding sites for chip-to-package connections. The present disclosure explores the structure of an interconnect element and methods of forming the interconnect element during a MEOL process and/or a BEOL process for improved IC device performance. In particular, the present disclosure proposes a structure of the metal-zero ($M_0$) and a method making the same. The interconnect structure includes metal lines distributed in multiple metal layers ($M_0$, $M_1$, $M_2$, . . . from the bottom to the top) to provide horizontal routing, vias distributed between metal layers to provide vertical routing, and contacts to provide connection between the overlying conductive features (such as vias) and device features (such as a gate, a source and a drain of a transistor). Effects of the interconnect structure has reduced resistance, increased adhesion and barrier effect, and improved gas filling.

FIG. 1 illustrates a three-dimensional view of a semiconductor device structure 100, in accordance with an embodiment. In the example of FIG. 1, the semiconductor device structure 100 includes a fin-like field effect transistor (FinFET) device and an interconnect structure 120 formed on the FinFET device. The interconnect structure 120 electrically connect the FinFET device and other devices (such as other FinFET devices and/or capacitors) into a functional circuit. The interconnect structure 120 includes various conductive features, especially a bilayer conductive feature 126. The bilayer conductive feature 126 is electrically connected to a device feature of the FinFET device through underlying conductive features (such as a contact and a via) and electrically connected to overlying conductive features (such as metal lines and vias) to provide electrical signal or power to the corresponding S/D feature 114. Other conductive features of the interconnect structure 120 are not shown in FIG. 1 for the sake of clarity and simplicity. The FinFET device of FIG. 1 may be fabricated in a FEOL process, while the contact features may be formed in a MEOL process. In some embodiments, the semiconductor device structure 100 may be included or may be a part of an integrated circuit (IC) device. Exemplary IC devices include static random-access memory (SRAM) and/or other logic circuits. The semiconductor device structure 100 may be electrically and/or communicatively coupled to passive components (e.g., resistors, capacitors, and/or inductors) and/or other active components (e.g., p-type field effect transistors (pFETs), n-type FETs (nFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells). The present disclosure is not limited to any particular number of devices or device regions, or to any particular device configurations.

The semiconductor device structure 100 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor. The substrate 102 may, in some examples, include a semiconductor-on-insulator substrate, such as Si-on-insulator (SOI), SiGe-on-insulator (SGOI), Ge-on-insulator (GOI) substrates.

The semiconductor device structure 100 also includes one or more fin structures 104 (e.g., Si fins) that extend from the substrate 102. Only one fin structure 104 is shown in FIG. 1 for the sake of clarity and simplicity. The fin structure 104 may be formed using any suitable method. For example, the fin structure 104 may be formed using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins. The patterning may utilize multiple etching processes which may include a dry etching and/or wet etching. The regions in which the fin structure 104 is formed may be used to form active devices through subsequent processing and are thus referred to as active regions.

The semiconductor device structure 100 includes isolation features 106, which may be shallow trench isolation (STI) features. In some examples, the formation of the isolation features 106 includes etching trenches into the substrate 102 between the active regions and filling the trenches with one or more dielectric materials such as silicon oxide, silicon nitride, silicon oxynitride, other suitable materials, or combinations thereof. Any appropriate methods, such as a chemical vapor deposition (CVD) process, an atomic layer deposition (ALD) process, a physical vapor deposition (PVD) process, a plasma-enhanced CVD (PECVD) process, a plasma-enhanced ALD (PEALD) process, and/or combinations thereof may be used for depositing the isolation features 203. The isolation features 106 may have a multi-layer structure such as a thermal oxide liner layer over the substrate 102 and a filling layer (e.g., silicon nitride or silicon oxide) over the thermal oxide liner layer. Alternatively, the isolation features 106 may be formed using any other isolation formation techniques. As illustrated in FIG. 1, a lower portion of the fin structure 104 is surrounded by the isolation features 106, and an upper portion of the fin structure 104 protrudes from the isolation features 106. In other words, a portion of the fin structure 104 is embedded in the isolation features 106. The isolation features 106 prevents electrical interference or crosstalk between adjacent transistor devices.

The semiconductor device structure 100 further includes a gate stack structure that engages a channel region of the fin structure 104. The gate stack structure includes a gate dielectric layer 108 and a gate electrode 110. Spacers 112 are formed on opposite sidewalls of the gate stack structure. In one example, the gate electrode 110 is a metal-containing gate electrode, and the gate dielectric layer 108 is a high high-k dielectric material.

Figure 2A:
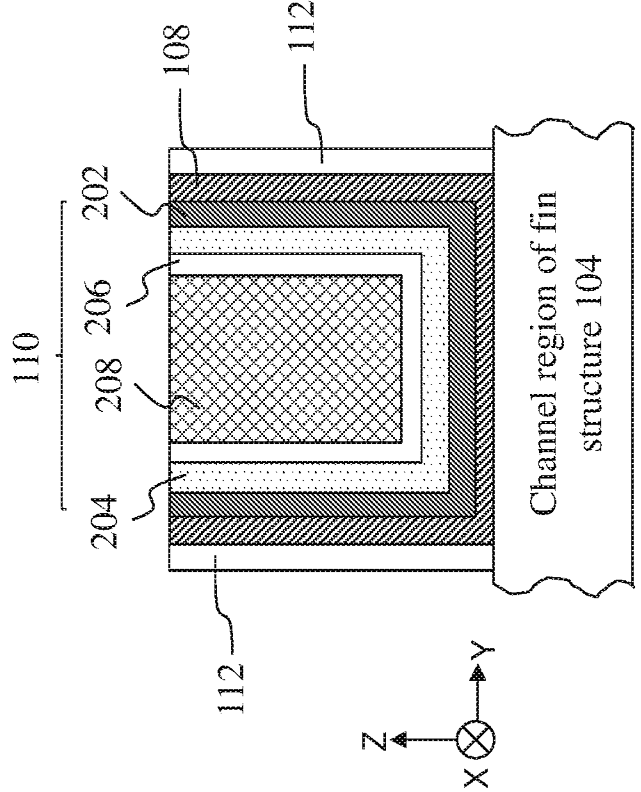
FIGS. 2A-2B show cross-sectional views of a gate stack structure and a bilayer conductive feature, respectively, in accordance with various embodiments.

In a further example, the gate electrode 110 is a metal gate electrode, and the gate dielectric layer 108 is a high-k dielectric material layer. In such embodiments, the gate stack structure may further include a capping layer 202, a work function layer 204, a seed layer 206, and a filling metal 208, as seen in FIG. 2A. It is noted that FIG. 2A is a cross-sectional view taken along the line A-A' shown in FIG. 1. FIG. 2A also shows the spacers 112 formed on opposite sidewalls of the gate stack structure. In the example of FIG. 2A, the gate dielectric layer 108 may include a dielectric material having a dielectric constant greater than a dielectric constant of $SiO_2$, which is approximately 3.9. For example, the gate dielectric layer 108 may include hafnium oxide ($HfO_2$), which has a dielectric constant in a range from about 18 to about 40. As various other examples, the gate dielectric layer 108 may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, metal nitride, or combinations thereof. The gate dielectric layer 108 may be formed by any suitable processes, such as molecular beam deposition (MBD), CVD, PECVD, PVD, ALD, or combinations thereof. The gate dielectric layer 108 may further include an interfacial layer, such as silicon oxide, formed between the channel region of the fin structure 104 and the high-k dielectric layer.

The capping layer 202 is formed on the gate dielectric layer 108 and may include an electrically conductive material such as titanium nitride, although other materials, such as tantalum nitride, titanium, tantalum, or the like, may alternatively be utilized. The capping layer 202 may be formed using a CVD process, such as PECVD.

The work function layer 204 is formed over the capping layer 202. In a p-type FinFET device, a p-type work function layer may be used and may include TiN, TaN, Ru, Mo, Al, WN, $ZrSi_2$, $MoSi_2$, $TaSi_2$, $NiSi_2$, WN, other suitable p-type work function materials, or a combination thereof. In an n-type FinFET device, an n-type work function layer may be used and may include Ti, Ag, TaAl, TaAlC, TiAlN, TaC, TaCN, TaSiN, Mn, Zr, other suitable n-type work function materials, or a combination thereof. In some embodiments, the work function layer 204 may be omitted.

The seed layer 206 may be formed over the work function layer 204. The seed layer 206 may include copper (Cu), titanium (Ti), tantalum (Ta), titanium nitride (TiN), tantalum nitride (TaN), the like, or a combination thereof, and may be deposited by ALD, sputtering, physical vapor deposition (PVD), or the like.

The filling metal layer 208 may be formed over the seed layer 206. The filling metal layer 208 includes aluminum, tungsten, copper or other suitable metal. The filling metal layer 208 is deposited by a suitable technique, such as plating, PVD, CVD or ALD. In the stated example where the gate stack structure includes a metal gate electrode over a high-k dielectric layer, the filling metal 208 may include any suitable materials, such as titanium nitride (TiN), tantalum nitride (TaN), titanium aluminide (TiAl), titanium aluminum nitride (TiAlN), tantalum aluminide (TaAl), tantalum aluminum nitride (TaAlN), tantalum aluminum carbide (TaAlC), tantalum carbonitride (TaCN), aluminum (Al), tungsten (W), copper (Cu), cobalt (Co), nickel (Ni), platinum (Pt), or combinations thereof.

As shown in FIG. 1, spacers 112 are formed on opposite sidewalls of the gate stack structure. The spacers 112 may include silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, or combinations thereof. The spacers 112 may include a single layer or a multi-layer structure. In some embodiments, the spacers 112 may be formed by depositing a spacer layer (containing the dielectric material) over the gate electrode 110, followed by an anisotropic etching process to remove portions of the spacer layer from the top surfaces of the gate electrode 110. After the etching process, portions of the spacer layer on the sidewall surfaces of the gate electrode 110 substantially remain and become the spacers 112. In some embodiments, the anisotropic etching process is a dry (e.g. plasma) etching process. Additionally or alternatively, the formation of the spacers 112 may also involve chemical oxidation, thermal oxidation, ALD, CVD, and/or other suitable methods.

The semiconductor device structure 100 further includes source/drain (S/D) features 114 that are disposed on opposite sides of the gate stack structure. The S/D features 114 may include any suitable semiconductor materials and may be formed by any suitable process. For example, the S/D features 114 may be formed by appropriately doping S/D regions of the fin structure 104. The doping processes may include ion implantation process and/or a diffusion process. Additionally or alternatively, the S/D features 114 may be formed by an epitaxial process. For example, the S/D features 114 in an n-type FinFET device may include Si, SiC, SiP, SiAs, SiPC, or combinations thereof; while the S/D features 114 in a p-type FinFET device may include Si, SiGe, Ge, SiGeC, or combinations thereof. The S/D features 114 may be doped in-situ or ex-situ. For example, epitaxially-grown silicon S/D features 114 may be doped with carbon to form silicon:carbon (Si:C) S/D features 114, phosphorous to form silicon:phosphor (Si:P) S/D features 114, or both carbon and phosphorous to form silicon carbon phosphor (SiCP) S/D features 114; and the epitaxially grown SiGe S/D features 114 may be doped with boron. One or more annealing processes may be performed to activate the dopants in the S/D features 114. The annealing processes may include rapid thermal annealing (RTA) and/or laser annealing processes.

In some embodiments, the S/D features 114 may include raised S/D features formed by selective epitaxial growth for strain effect with enhanced carrier mobility and device performance. The raised S/D features 114 are formed by one or more epitaxial (epi) processes, whereby Si features, SiGe features, SiC features, and/or other suitable features are grown in a crystalline state on the fin active regions 104. Alternatively, an etching process is applied to recess the S/D regions before the epitaxial growth. Suitable epitaxial processes include CVD deposition techniques (e.g., vapor-phase epitaxy (VPE) and/or ultra-high vacuum CVD (UHV-CVD), molecular beam epitaxy, and/or other suitable processes. The epitaxial process may use gaseous and/or liquid precursors, which interact with the composition of the fin structure 104. In some embodiments, adjacent sources/drains may be grown to merge together to provide increased contact area and reduce the contact resistance. This can be achieved by controlling the epitaxial growth process. The gate stack (including the gate dielectric layer 108 and the gate electrode 110), the S/D features 114 and the channel region of the active region 104 underlying the gate stack form a FET device 116.

Figure 2B:
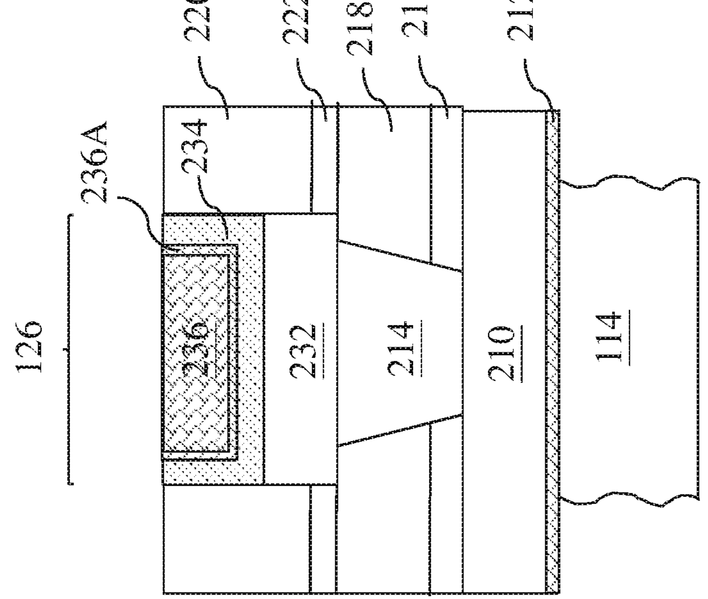

FIG. 2B is a cross-sectional view taken along the line A-A' shown in FIG. 1. As shown in FIG. 2B, various conductive features formed on the S/D feature 114. A contact feature 210 is formed on the S/D feature 114. The contact feature 210 includes a suitable conductive material, such as tungsten (W), cobalt (Co), ruthenium (Ru), or other suitable conductive material, deposited by suitable technique, such as CVD, ALD or PVD. The contact feature 210 may be formed by a procedure that includes forming a contact hole in a dielectric layer by lithography process and etching;

depositing one or more conductive material in the contact hole; and performing a chemical mechanical polishing (CMP).

The contact feature 210 includes a silicide layer and a barrier layer. Prior to the filling in the conductive core in the contact holes, the silicide layer may be formed on the source/drain features 212 to further reduce the contact resistance. The silicide includes silicon and metal, such as titanium silicide, tantalum silicide, nickel silicide or cobalt silicide. The silicide may be formed by a process referred to as self-aligned silicide (or salicide). The process includes metal deposition, annealing to react the metal with silicon, and etching to remove unreacted metal. A barrier layer may be deposited in the contact hole to separate the conductive material from the surrounding dielectric material. The barrier layer may include an electrically conductive material such as titanium (Ti), titanium nitride (TiN), tantalum (Ta), tantalum nitride (TaN), or the like, and may be formed using a CVD process, such as PECVD. The barrier layer may have a thickness ranging between 1 nm and 5 nm.

In some embodiments, a dielectric layer may be formed over the fin structure 104 and the isolation features 106, thereby encapsulating the gate stack structure, S/D features 114, and contact features 210. The dielectric layer is not shown in FIGS. 1 and 2B for the sake of simplicity and clarity. The dielectric layer may include silicon oxide, a low-k dielectric material (e.g. a material having a dielectric constant less than the dielectric constant of $SiO_2$, which is approximately 3.9), or other suitable dielectric materials. Some examples of other suitable dielectric materials include phosphosilicate glass (PSG), borosilicate glass (BSG), boron-doped phosphosilicate glass (BPSG), undoped silicate glass (USG), or the like. The dielectric layer may be deposited by any suitable method, such as CVD, PECVD, or FCVD. As stated above, the contact features 210 may be formed in a MEOL process, while other features of the semiconductor device structure 100 may be formed in an FEOL process.

A via feature 214 is formed on the contact feature 210 and electrically connected to the S/D feature 114 through the contact feature 210. The via feature 214 may have a similar geometry of the contact feature 210, such as the width of the top surface being greater than the width of the bottom surface. The via feature 214 includes a suitable conductive material, such as tungsten (W); cobalt (Co); ruthenium (Ru); Co, W or Ru-based compound or alloy doped with other element, such as zirconium (Zr), tin (Sn), silver (Ag), copper (Cu), gold aluminum (AuAl), calcium (Ca), beryllium (Be), magnesium (Mg), rhodium (Rh), sodium (Na), iridium (Jr), tungsten (W), molybdenum (Mo), zinc (Zn), nickel (Ni), potassium (K), cadmium (Cd), indium (In), Ru, Co, osmium (Os), silicon (Si), germanium (Ge), and manganese (Mn); or other suitable conductive material, deposited by suitable technique, such as CVD, ALD or PVD. The formation of the via feature 214 may include: depositing a contact-etch-stop layer (CESL) 216; forming an interlayer dielectric (ILD) layer 218; forming an opening in the ILD layer 218; and forming the via feature 214 in the opening. The CESL 216 may include silicon nitride ($Si_3N_4$), silicon oxide ($SiO_2$), silicon oxynitride (SiON), silicon oxycarbide (SiOC), silicon oxycarbonitride (SiOCN), and/or other materials. The CESL 216 may be formed by CVD, ALD or other suitable deposition technique. The ILD layer 218 may include silicon oxide, silicon nitride, silicon carbon oxide, silicon carbon oxynitride, low-k dielectric material or other suitable dielectric material. The ILD layer 218 may be formed by deposition and CMP. The deposition of the ILD layer 218 may include a suitable deposition technique, such as flowable CVD (FCVD). The Via feature 214 may further include a barrier layer (such as tantalum nitride, tantalum, titanium nitride, titanium or a combination thereof) deposited in the via opening to separate the via feature from the surrounding ILD layer. The barrier layer may have a thickness ranging between 1 nm and 5 nm. In some examples, the via feature 214 has a via height ranging between 5 nm and 30 nm and a via width ranging between 5 nm and 30 nm.

Figure 3:
FIG. 3 shows a cross-sectional view of a bilayer contact feature, in accordance with various embodiments.
Figure 3:
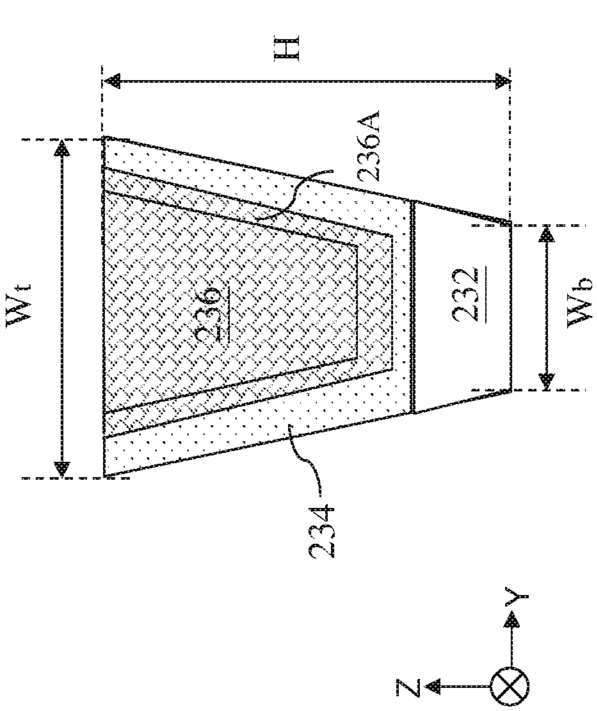

The bilayer conductive feature 126 is further formed on the via feature 214 and electrically connected to the S/D features 114 through the contact feature 210 and the via feature 214. The bilayer conductive feature 126 may have a geometry with different widths at the top surface and the bottom surface, as illustrated in FIG. 3 in a cross-sectional view. In some embodiments, the bilayer conductive feature 126 includes a top width $W_t$ and a bottom width $W_b$ being less than the top width. For examples, the ratio $W_t/W_b$ is greater than 1.1. In some examples, the ratio $W_t/W_b$ ranges between 1.1 and 1.3. In furtherance of the examples, $W_t$ ranges between 5 nm and 150 nm. The bilayer conductive feature 126 may have a thickness ranging between 10 nm and 60 nm. In the present embodiment, the bilayer conductive feature 126 is a metal line of a lowest metal layer (also referred to as $M_0$), formed during the BEOL process. The bilayer conductive feature 126 is formed in another ILD layer 220, similar to the ILD layer 218 in terms of composition and formation. In some embodiment, an etch-stop layer (ESL) 222 may be deposited before depositing the ILD layer 220. The ESL 222 is similar to the CESL 216 in terms of composition and formation according to some examples. The bilayer conductive feature 126 is formed in a trench of the ILD layer 220 and has a bilayer structure.

The bilayer conductive feature 126 is formed in a trench of the ILD layer 220 and includes a bottom metal feature 232, a barrier layer 234 and a top metal feature 236, formed in the same trench, as illustrated in FIG. 2B or FIG. 3. The trench for the bilayer conductive feature 126 will be further described later with the method fabricating the semiconductor device structure 100. The trench includes a lower portion and an upper portion. The bottom metal feature 232 is formed in the lower portion of the trench while the top metal feature 236 and the barrier layer 234 are formed in the upper portion of the trench. The lower portion and the upper portion of the trench may have different dimensions. However, since the bottom metal feature 232, the barrier layer 234 and the top metal feature 236 are formed in the same trench, the bottom surface of the barrier layer 234 and the top surface of the bottom metal feature 232 are fully aligned. Especially, the sidewalls of the barrier layer 234 and the bottom metal feature 232 forms a continuous profile with a continuous sidewall slope, which mean that the slope does not have abrupt change when extending from the barrier layer 234 to the bottom metal feature 232. In some embodiments, the sidewall slope is substantially constant from the barrier layer 234 to the bottom metal feature 232. In furtherance of the embodiments, the sidewall slope ranges between 75 degrees and 90 degrees.

The bottom metal feature 232 and the top metal feature 236 have different metal compositions so to tune the gap filling capability and the conductivity, respectively. Compared with a single-layer conductive feature, one metal, such as copper, fills in the trench and extends from the top to the bottom, which experiences both gap filling issue and resistance issue due to high aspect ratio of the trench in the advanced technology nodes. If one metal is chosen to have better gap filling capability, it will sacrifice the conductivity, leading to high resistance.

Furthermore, the bottom metal feature 232 is barrier-free and directly contacts the dielectric materials of the ILD layer 220 and the ESL 222, which eliminates the reduction of the trench dimension by the barrier layer. Especially, it is more beneficial when the bottom portion of the trench has narrow opening. In this case, the metal material of the bottom metal feature 232 is chosen to have high gap-filling capability and to have no diffusion concerns of the metal material diffusing into the dielectric materials.

However, the metal material of the top metal feature 236 is chosen to have higher conductivity with a barrier to protect the metal material from diffusion. Since the upper portion of the trench has a reduced aspect ratio and a greater opening, the Addition of a barrier layer does not impact much to the gap filling of the top metal feature 236. Furthermore, the barrier layer 234 is designed to also function as a liner to provide wetting surface and adhesion strength for the top metal layer formed thereon. Therefore, this barrier layer 234 is also referred to as the collective barrier layer 234. It is noted that that barrier layer cannot be replaceable by a liner that only functions to provide wetting surface and adhesion strength without barrier function to sufficiently prevent the metal material of the top metal feature 236 from diffusing into the surrounding dielectric materials. The collective barrier layer 234 may include one film to function for both barrier and liner, or alternatively may include two different films with one film substantially for barrier function and another film substantially for adhesion function. With above analysis, consideration and design, the materials of the bottom metal feature 232, the collective barrier layer 234 and the top metal feature 236 are further described in detail.

In some embodiments, the bottom metal feature 232 includes ruthenium (Ru); cobalt (Co); tungsten (W); Co—W—Ru-based alloy, other suitable conductive material, or a combination thereof. The bottom metal feature 232 may have a thickness ranging between 1 nm and 30 nm. The bottom metal feature 232 is formed by a selective deposition, such as a bottom-up deposition. In furtherance of at least one embodiment, the bottom-up deposition to form the bottom metal feature 232 of Ru includes depositing Ru by performing a chemical vapor deposition (CVD) using a Ru-containing precursor with a deposition temperature ranging between 100° C. and 200° C. In some embodiments, the precursor includes $C_{10}H_{10}Ru$, $C_7H_9RuC_7H_9$, $Ru_3CO_{12}$, $Ru(C_5(CH_3)_5)_2$, the like, or a combination thereof, and with a carrier gas, such as argon and/or nitrogen, in some instances.

In the present embodiment, the barrier layer 234 includes a dual-film scheme, such as a tantalum nitride film and a tantalum film on the tantalum film. In this case, the tantalum nitride film substantially functions as a barrier to prevent the metal from diffusing into the dielectric material while the tantalum film substantially functions as a liner to provide a wetting surface for adhesion. In some embodiments, the barrier layer 234 includes tantalum nitride, tantalum, titanium nitride, titanium, or a combination thereof. In some embodiments, the barrier layer 234 may include ruthenium (Ru), cobalt (Co), titanium (Ti), tantalum (Ta), and a combination thereof. The barrier layer 234 may have a thickness ranging between 1 nm and 5 nm.

In some embodiments, the top metal feature 236 includes copper (Cu), aluminum (Al), molybdenum (Mo) or other suitable conductive material. The top metal feature 236 may have a thickness ranging between 5 nm and 30 nm. The top metal feature 228 may be formed by a procedure that includes deposition and CMP. In some embodiments, the deposition includes plating. In furtherance of the embodiments, a seed layer 236A (such as (Cu) is formed by a suitable deposition method, such as PVD or ALD, prior to the plating process. Then, a bulk metal (such as Cu) is filled in the top portion of the trench by plating. Thereafter, A CMP process is applied to remove the excessive metal and planarize the top surface.

In some embodiments, the bottom metal feature 232 has a first thickness $T_1$; the top metal feature 236 has a second thickness $T_2$; and the barrier layer has a third thickness $T_3$. In furtherance of the embodiments, a ratio of the second thickness $T_2$ to first thickness $T_1$, $T_2/T_1$, ranges between 5 and 1.2 and a ratio of the third thickness $T_3$ to first thickness $T_1$, $T_3/T_1$, ranges between 0.2 and 0.5.

FIGS. 4A, 4B, and 5 through 7 are cross-sectional views of the semiconductor device structure 100 at various fabrication stages constructed in accordance with some embodiments. FIG. 8 is a flowchart of a method 800 making the semiconductor device structure 100, especially the bilayer conductive feature 126. The formation of the bilayer conductive feature 126 is further described in detail with reference to FIGS. 4 through 8.

Referring to FIG. 8, the method 800 includes an operation 820 to form the bilayer conductive feature 126, which further includes sub-operations 832 through 838. The method 800 may further include operations before, during or after the operation 820 to form the bilayer conductive feature 126. For example, the method 800 includes operations 802 through 814 to form fin active regions 104, the isolation features 106, the S/D features 114, and the metal gate stacks during the FEOL process. The method 800 also includes operations 816 and 818 to form contact features 210 and the via features 214 during the MEOL process. The method 800 also includes other operations, such as 822 to form other conductive features of the interconnect structure 120 during the BEOL process, which include metal lines in various metal layers (such as $M_1$, $M_2$, $M_3$, and etc.) and via features between adjacent metal layers using a proper technique, such as dual damascene process. Especially, the method 800 includes an operation 820 to form the bilayer conductive feature 126, which further includes sub-operations 831 through 838 and is described in detail below.

Figure 4A:
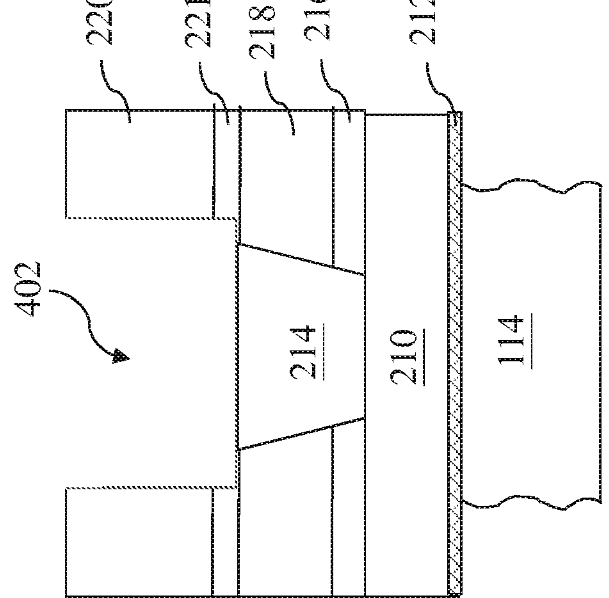
FIGS. 4A, 4B, 5, 6, and 7 show cross-sectional views of the semiconductor device structure, in accordance with an embodiment.
Figure 4A:

Referring to FIG. 4A, the method 800 includes an operation 831 by forming the ILD layer 220 by a suitable procedure. The ILD layer 220 may additionally include an etch-stop layer (ESL) 222. The ILD layer 220 may be formed by a procedure that includes: depositing the ESL 222 by CVD or ALD; depositing the ILD layer 220 by CVD, flowable CVD (FCVD), or other suitable deposition technique; and a CMP process to planarize the top surface. The ESL 222 may include silicon nitride, silicon oxynitride, other suitable dielectric material or a combination thereof. The ILD layer 220 may include silicon oxide, low-k dielectric material, other suitable dielectric material or a combination thereof.

Figure 4B:
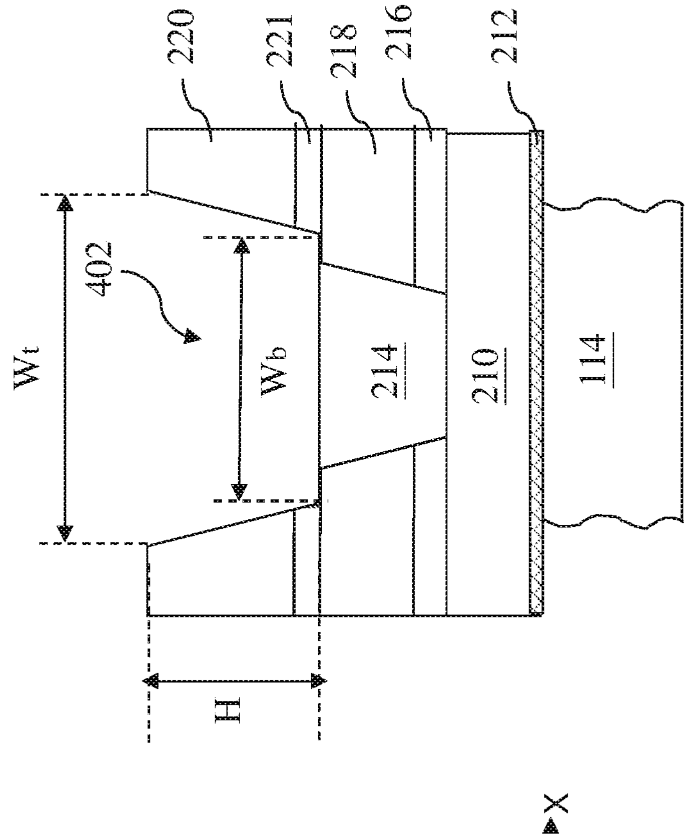

Still referring to FIG. 4A, the method 800 includes an operation 832 by forming a trench 402 in the ILD layer 220 by lithography process and etching. The underlying conductive feature, such as via feature 214, is exposed within the trench 402. In some embodiments, the trench 402 has tilted sidewalls and has uneven widths from the top to the bottom, such as a top width $W_t$ and a bottom width $W_b$ being less than the top width, as illustrated in FIG. 4B. This can be tuned by varying the etching process. When the etching process (such as plasma etching) is more anisotropic and has less lateral etching bias, the difference between the top width $W_t$ and the bottom width $W_b$ is decreased. For example, when the etching process is anisotropic and is directional, the ratio $W_t/W_b$ is 1, as illustrated in FIG. 4A. When the etching process (such as a wet etching) is closer to isotropic etching and has more lateral etching bias, the difference between the top width $W_t$ and the bottom width $W_b$ is increased. For examples, the ratio $W_t/W_b$ is greater than 1.1. In some examples, the ratio $W_t/W_b$ ranges between 1.1 and 1.3. In furtherance of the examples, $W_t$ ranges between 5 nm and 150 nm. In some examples, the trench 402 may have a height H ranging between 10 nm and 60 nm.

The operation 832 may further use a hard mask for patterning. In this case, a hard mask is deposited on the ILD layer 220; a patterned resist layer is formed on the hard mask by a lithography process; an etching process is applied to transfer the openings of the patterned resist layer to the hard mask; and another etching process is applied to the ILD layer 220 to form the trench 402. The hard mask may be removed thereafter.

Figure 5:
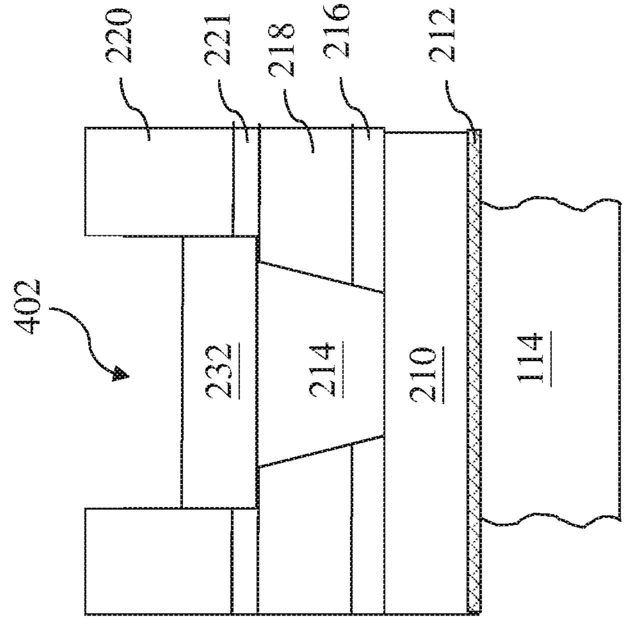
Figure 5:
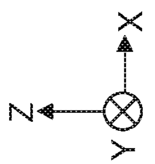

Referring to FIG. 5, the method 800 includes an operation 834 by forming the bottom metal feature 232 in the trench 402 using a bottom-up deposition. The bottom-up deposition selectively deposits on the bottom surface. It is noted that the bottom metal feature 232 is formed without a barrier layer and therefore directly contacts the dielectric surfaces, such as the sidewalls of the ILD layer 220 (and the ESL 222). In the present case, the bottom-up deposition selectively deposits a metal material on the conductive surface but not on the dielectric surfaces. More specifically, the metal of the bottom metal feature 232 is a Ru film according to the present embodiment, and it is formed by a bottom-up deposition that includes a CVD process using a precursor including $Ru_3CO_{12}$ with a deposition temperature ranging between 100° C. and 200° C. In other embodiments, the bottom metal feature 232 may include Co, W, Ru, or a combination thereof, such as Co—W—Ru-based alloy. In the embodiment, the bottom metal feature 232 is different from the underlying metal feature 214 in composition for enhanced high-aspect ratio filling and reduced contact resistance.

Figure 6:
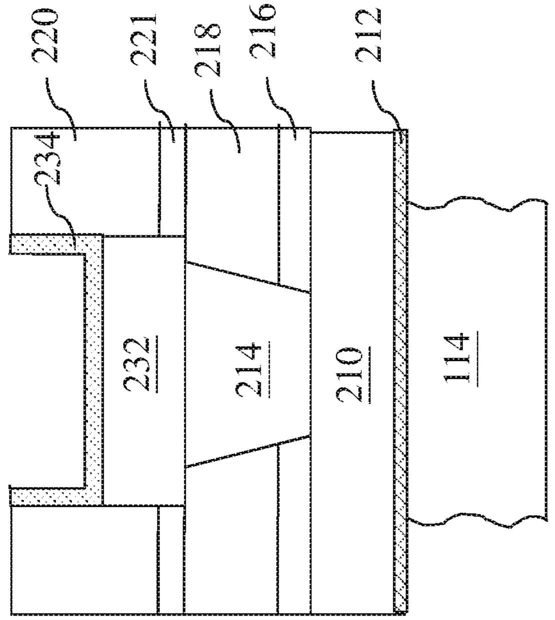
Figure 6:
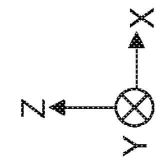

Referring to FIG. 6, the method 800 includes an operation 836 by forming a barrier layer 234 on the bottom metal feature 232 within the trench 402 using a proper deposition, such as ALD, PVD or CVD. The barrier layer 234 is conformally deposited on the bottom metal feature 232 and the sidewalls of the ILD layer 220. The barrier layer 234 may also be deposited on the top surface of the ILD layer 220 but will be removed at later stage, such as CMP.

Figure 7:
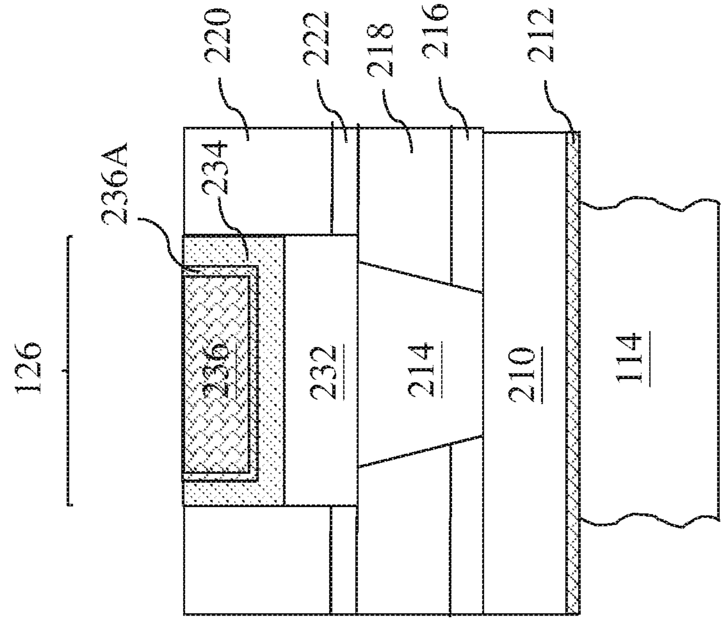
Figure 7:
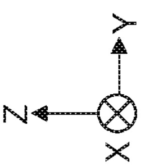
Figure 7:
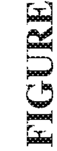
Figure 8:
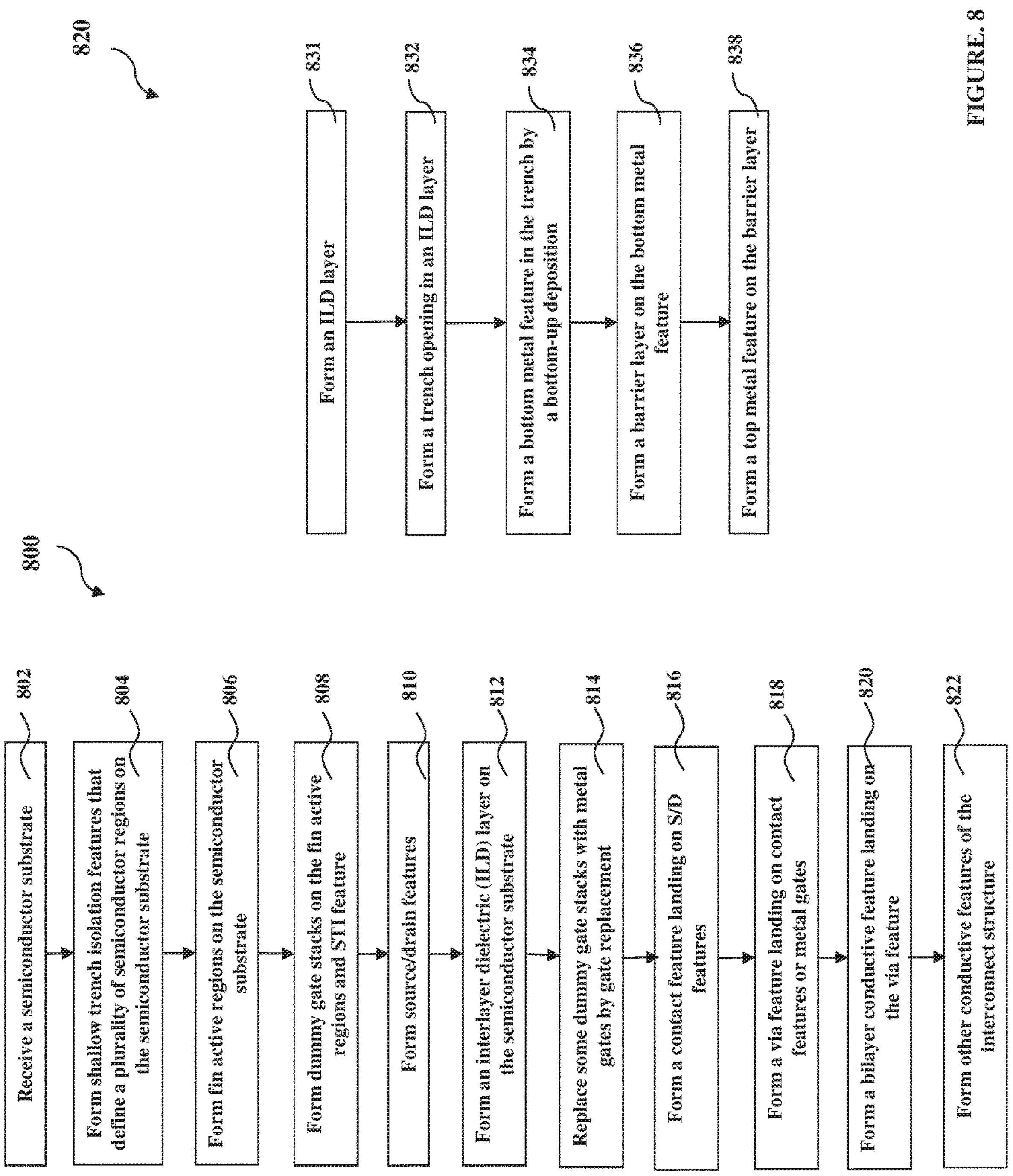
FIG. 8 is a flowchart of a method making the semiconductor device structure, in accordance with various embodiments.

Referring to FIG. 7, the method 800 includes an operation 838 by forming the top metal feature 236 on the barrier layer 234 to fill the trench 402 using a proper deposition, such as ALD, PVD, CVD, plating, other suitable deposition or a combination thereof. For example, a seed layer 236A may be deposited in the trench 402 by ALD or PVD, and then a plating process is applied to deposit the top metal feature on the seed layer to fill the trench 402. A CMP process may be further applied to remove the excessive metal and planarize the top surface.

In the thus formed bilayer conductive feature 126, the top metal feature 236 and the bottom metal feature 232 are separated by the barrier layer 234. The top metal feature 236 is isolated from the dielectric materials while the bottom metal feature 232 directly contacts the ILD layer 220. and the ESL 222. As the top metal feature 236 and the bottom metal feature 232 are formed in the same trench with continuous sidewalls, the bottom surface of the barrier layer 234 matches and is aligned with the top surface of the bottom metal feature 232, as illustrated in FIG. 7 and FIG. 3B. The sidewalls of the ILD layer 220 are continuous and may have tilted profile. Accordingly, the sidewalls of the barrier layer 234 and the bottom metal feature 232 form continuous surfaces extending along the sidewalls of the ILD layer 220 and the ESL 222.

In the present embodiment, such formed bilayer conductive feature 126 is electrically connected to the S/D feature 114. Alternatively, the bilayer conductive feature 126 is configured to be electrically connected to the gate electrode 110 of the high-k metal gate stack through the via feature 214. In some other embodiments, the structure and method of the bilayer conductive feature 126 may be applied to form other portions of the interconnect structure 120, such as via features or metal lines in the overlying metal layer. In other embodiments, the bilayer conductive feature 126 may be used in a semiconductor device structure having vertically stacked channels, such as a gate-all-around (GAA) structure.

The present disclosure provides a semiconductor device structure having a bilayer conductive feature 126 and a method making the same. The bilayer conductive feature 126 is formed in a trench of the ILD layer 220 and includes a bottom metal feature 232, a barrier layer 234 and a top metal feature 236, formed in the same trench 402. By implementing the disclosed semiconductor device structure having the bilayer conductive feature 126 and the method 900 making the same in various embodiments, some of advantages described below may present. However, it is understood that different embodiments disclosed herein offer different advantages and that no particular advantage is necessarily required in all embodiments. The structure of the bilayer conductive feature 126 provides more freedom to separately choose the material of the bottom metal feature 232 with higher gap filling capability and choose the material of the top metal feature 236 with lower resistivity. Furthermore, the bottom metal feature 232 is barrier-free and directly contacts the dielectric materials of the ILD layer 220 and the ESL 222, which eliminates the dimensional reduction of the trench from the barrier layer. Especially, it is more beneficial when the bottom portion of the trench has narrower opening. In this case, the metal material of the bottom metal feature 232 is chosen to have high gap-filling capability and to have no diffusion concerns of the metal material diffusing into the dielectric materials.

In one example aspect, the present disclosure provides a method of semiconductor fabrication. The method includes forming a trench in a dielectric layer on a semiconductor substrate; forming a bottom metal feature of a first metal in a lower portion of the trench by a selective deposition; depositing a barrier layer in an upper portion of the trench, the barrier layer directly contacting both a top surface of the bottom metal feature and sidewalls of the dielectric layer; and forming a top metal feature of a second metal on the barrier layer, filling in the upper portion of the trench, wherein the second metal is different from the first metal in composition.

Another one aspect of the present disclosure pertains to a method of semiconductor fabrication. The method includes receiving a semiconductor substrate having a field-effect transistor formed thereon and an underlying conductive stack electrically connected to the field-effect transistor; depositing a dielectric layer on the semiconductor substrate; forming a trench in the dielectric layer such that the conductive feature is exposed within the trench, wherein the trench includes a lower portion and an upper portion continuously extending from the lower portion; forming a bottom metal feature of a first metal in the lower portion of the trench by a bottom-up deposition, wherein the first metal is different from that of the underlying conductive stack; depositing a barrier layer on the bottom metal feature and along sidewalls of the dielectric layer within the upper portion of the trench; and forming a top metal feature of a second metal on the barrier layer, thereby filling the second metal in the upper portion of the trench.

Yet another aspect of the present disclosure pertains to a semiconductor device structure. The semiconductor device structure includes includes a field-effect transistor formed on a semiconductor substrate, wherein the field-effect transistor includes a gate stack disposed on an active region of the semiconductor substrate, and source/drain (S/D) features formed on the active region and interposed by the gate stack; and a conductive feature formed in a dielectric layer and electrically connected to at least one of the gate electrode and the S/D features. The conductive feature includes a bottom metal feature of a first metal directly contacting the dielectric layer; a top metal feature of a second metal over the bottom metal feature, wherein the second metal is different from the first metal in composition; and a barrier layer surrounding the top metal feature and separating the bottom metal feature from the top metal feature.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:

a field-effect transistor formed on a semiconductor substrate, wherein the field-effect transistor includes a gate stack disposed on an active region of the semiconductor substrate, and source/drain (S/D) features formed on the active region and interposed by the gate stack; and a metal layer in a multilayer dielectric layer, wherein the metal layer and the multilayer dielectric layer belong to a single level of an interconnect structure, wherein the metal layer includes a conductive feature in the multilayer dielectric layer, wherein the conductive feature has a height equal to a first thickness of the multilayer dielectric layer, wherein the conductive feature is electrically connected to one of the S/D features, wherein the conductive feature includes:

a bottom metal feature formed by a single bottom metal layer of a first metal, wherein the bottom metal feature abuts an etch stop layer and an interlayer dielectric layer of the multilayer dielectric layer, wherein the etch stop layer has a second thickness, the interlayer dielectric layer has a third thickness, the second thickness and the third thickness are each less than the first thickness, the single bottom metal layer has a fourth thickness that is greater than the second thickness, the etch stop layer forms a bottom of the multilayer dielectric layer, and the height, the first thickness, the second thickness, the third thickness, and the fourth thickness are along a same direction, a top metal feature formed by a barrier layer and a top metal layer of a second metal, wherein the second metal is different from the first metal, wherein the top metal feature is over the bottom metal feature, and wherein the barrier layer wraps the top metal layer and separates the single bottom metal layer from the top metal layer, the barrier layer abuts the interlayer dielectric layer of the multilayer dielectric layer, the barrier layer includes a bottom surface that spans an entire width of the conductive feature, the single bottom metal layer includes a top surface that spans the entire width of the conductive feature, and the bottom surface of the barrier layer abuts the top surface of the single bottom metal layer.

2. The semiconductor device structure of claim 1, wherein the barrier layer and the bottom metal layer combine to form sidewalls of the conductive feature.

3. The semiconductor device structure of claim 1, wherein the top metal feature formed by the barrier layer and the top metal layer has a fifth thickness, a sum of the fourth thickness and the fifth thickness is equal to the height, and the fifth thickness is along the same direction as the fourth thickness.

4. The semiconductor device structure of claim 3, wherein the fourth thickness is less than the fifth thickness.

5. The semiconductor device structure of claim 3, wherein a ratio of the fifth thickness to the fourth thickness ranges between 5 and 1.2.

6. The semiconductor device structure of claim 1, wherein the barrier layer and the top metal layer form a top surface of the top metal feature, and the barrier layer forms a bottom surface of the top metal feature.

7. The semiconductor device structure of claim 3, wherein:

the fourth thickness ranges between 1 nm and 30 nm;

the fifth thickness ranges between 5 nm and 30 nm; and the conductive feature has a width ranging between 5 nm and 150 nm.

8. An interconnect structure, comprising:

a source/drain contact disposed on a source/drain;

a metal via disposed on the source/drain contact, wherein the metal via is disposed in a first plurality of dielectric layers of a via level of an interconnect structure, wherein the first plurality of dielectric layers has a first thickness along a first direction, the metal via has a first height along the first direction between a top of the metal via and a bottom of the metal via, and the first height is equal to the first thickness; and a metal line disposed on the metal via, wherein the metal line is disposed in a second plurality of dielectric layers of a metal line level of the interconnect structure, the second plurality of dielectric layers has a second thickness along the first direction, the source/drain contact, the metal via, and the metal line are sequentially stacked along the first direction, the metal line has a second height along the first direction between a top of the metal line and a bottom of the metal line, the second height is equal to the second thickness, the metal line has a first sidewall and a second sidewall that extend from the top of the metal line to the bottom of the metal line, the metal line has a width along a second direction between the first sidewall and the second sidewall, the second direction is different than the first direction, and the metal line includes:

a first metal layer, a second metal layer, and a third metal layer, wherein the first metal layer forms a lower portion of the metal line having a third thickness along the first direction, the second metal layer and the third metal layer combine to form an upper portion of the metal line having a fourth thickness along the first direction, a sum of the third thickness and the fourth thickness is equal to the second height of the metal line, and the third thickness is greater than a fifth thickness of a bottom dielectric layer of the second plurality of dielectric layers, wherein the fifth thickness of the bottom dielectric layer of the second plurality of dielectric layers is less than the second thickness of the second plurality of dielectric layers, wherein the first metal layer extends the width of the metal line and forms a lower portion of the first sidewall of the metal line and a lower portion of the second sidewall of the metal line, the second metal layer extends the width of the metal line and forms an upper portion of the first sidewall of the metal line and an upper portion of the second sidewall of the metal line, wherein the first metal layer is between the metal via and the second metal layer and the first metal layer extends from a first sidewall of the second plurality of dielectric layers to a second sidewall of the second plurality of dielectric layers, and wherein the second metal layer is between the third metal layer and the first metal layer, the second metal layer is between the third metal layer and the second plurality of dielectric layers, and the second metal layer also extends from the first sidewall of the second plurality of dielectric layers to the second sidewall of the second plurality of dielectric layers.

9. The interconnect structure of claim 8, wherein the third metal layer has a width that is less than the width of the metal line.

10. The interconnect structure of claim 8, wherein the metal via, the first metal layer, and the third metal layer include a same metal material.

11. The interconnect structure of claim 8, wherein the metal via, the first metal layer, and the third metal layer include different metal materials.

12. The interconnect structure of claim 8, wherein the metal via and the first metal layer include a first metal material and the third metal layer include a second metal material.

13. The interconnect structure of claim 8, wherein the metal via includes a first metal material and the first metal layer and the third metal layer include a second metal material.

14. The interconnect structure of claim 8, wherein:

the first metal layer is a ruthenium layer;

the second metal layer is a tantalum nitride layer; and the third metal layer is a copper layer.

15. The interconnect structure of claim 14, wherein the metal via is a tungsten layer.

16. A device structure comprising:

a first etch stop layer having a first thickness, a first interlayer dielectric layer having a second thickness disposed on the first etch stop layer, a second etch stop layer having a third thickness disposed on the first interlayer dielectric layer, and a second interlayer dielectric layer having a fourth thickness disposed on the second etch stop layer, wherein the first etch stop layer, the first interlayer dielectric layer, the second etch stop layer, and the second interlayer dielectric layer are sequentially disposed over a substrate;

a first interconnect structure that extends through the first interlayer dielectric layer and the first etch stop layer and is electrically connected to a conductive feature of a transistor, wherein the first interconnect structure has a fifth thickness that is the same as a sum of the first thickness of the first etch stop layer and the second thickness of the first interlayer dielectric layer, wherein the first thickness is less than the second thickness; and a second interconnect structure that extends through the second interlayer dielectric layer and the second etch stop layer to the first interconnect structure, wherein the second interconnect structure has a sixth thickness that is the same as a sum of the third thickness of the second etch stop layer and the fourth thickness of the second interlayer dielectric layer, wherein the third thickness is less than the fourth thickness, and wherein the second interconnect structure includes:

a bottom layer having a seventh thickness disposed on the first interconnect structure, wherein sidewalls of the bottom layer interface with the second etch stop layer and the second interlayer dielectric layer, and a top portion having an eighth thickness disposed on the bottom layer, wherein the eighth thickness is greater than the seventh thickness, a sum of the seventh thickness and the eighth thickness is equal to the sixth thickness, and:

the top portion includes a first top layer and a second top layer over the first top layer;

a bottom of the first top layer interfaces with the bottom layer, sidewalls of the first top layer interface with the second interlayer dielectric layer, and a top of the first top layer interfaces with the second top layer; and the first top layer separates the second top layer from the bottom layer and the second interlayer dielectric layer.

17. The device structure of claim 16, wherein an interface between the first top layer and the bottom layer extends an entire width of the second interconnect structure.

18. The device structure of claim 17, wherein a length of an interface between the bottom layer and the first interconnect structure is less than a length of the interface between the first top layer and the bottom layer.

19. The device structure of claim 16, wherein:

the first etch stop layer and the second etch stop layer include nitrogen; and the first interlayer dielectric layer and the second interlayer dielectric layer include silicon and oxygen.

20. The device structure of claim 16, wherein:

the first interlayer dielectric layer and the second interlayer dielectric layer have different compositions; and the first etch stop layer and the second etch stop layer have different compositions.

* * * * *